United States Patent [19]
Sakai et al.

[11] Patent Number: 5,698,962
[45] Date of Patent: Dec. 16, 1997

[54] MEMORY EFFECT SENSITIVE BATTERY MONITORING APPARATUS FOR ELECTRIC VEHICLES

[75] Inventors: Shoji Sakai, Toyota; Mitsuo Inagaki, Okazaki; Sadahisa Onimaru, Chiryu; Hironori Asa, Okazaki, all of Japan

[73] Assignee: Nippon Soken, Inc., Nishio, Japan

[21] Appl. No.: 649,108

[22] Filed: May 17, 1996

[30] Foreign Application Priority Data

May 19, 1995 [JP] Japan .................. 7-145565

[51] Int. Cl.$^6$ .................................. H01M 10/46
[52] U.S. Cl. .................................. 320/13; 320/43
[58] Field of Search ................... 320/4, 5, 12, 13, 320/14, 21, 30, 35, 39, 43, 44, 48; 340/635, 636; 324/427, 432, 433; 429/90

[56] References Cited

U.S. PATENT DOCUMENTS

| | | | |
|---|---|---|---|
| 4,553,081 | 11/1985 | Koenck | 320/43 |
| 4,709,202 | 11/1987 | Koenck et al. | 320/43 |
| 4,845,419 | 7/1989 | Hacker | 320/39 |
| 5,268,845 | 12/1993 | Startup et al. | 340/636 X |
| 5,432,429 | 7/1995 | Armstrong, III et al. | 320/43 |

FOREIGN PATENT DOCUMENTS 5-77790  10/1993  Japan .

*Primary Examiner*—Edward Tso
*Attorney, Agent, or Firm*—Cushman, Darbvy & Cushman Ip Group of Pillsbury Madison & Sutro LLP

[57] ABSTRACT

A battery condition monitoring system which may be employed in an electric vehicle is disclosed. This system determines a terminal voltage of a battery under discharge of a given current and a consumption of electric energy stored in the battery and calculates a rate of change in terminal voltage of the battery relative to change in consumption of electric energy. When a difference between the rate of change in terminal voltage of the battery and a reference rate representing a rate of change in terminal voltage of a normal battery relative to change in consumption of electric energy is greater than a given value, the system determines that memory effect is occurring in the battery.

6 Claims, 6 Drawing Sheets

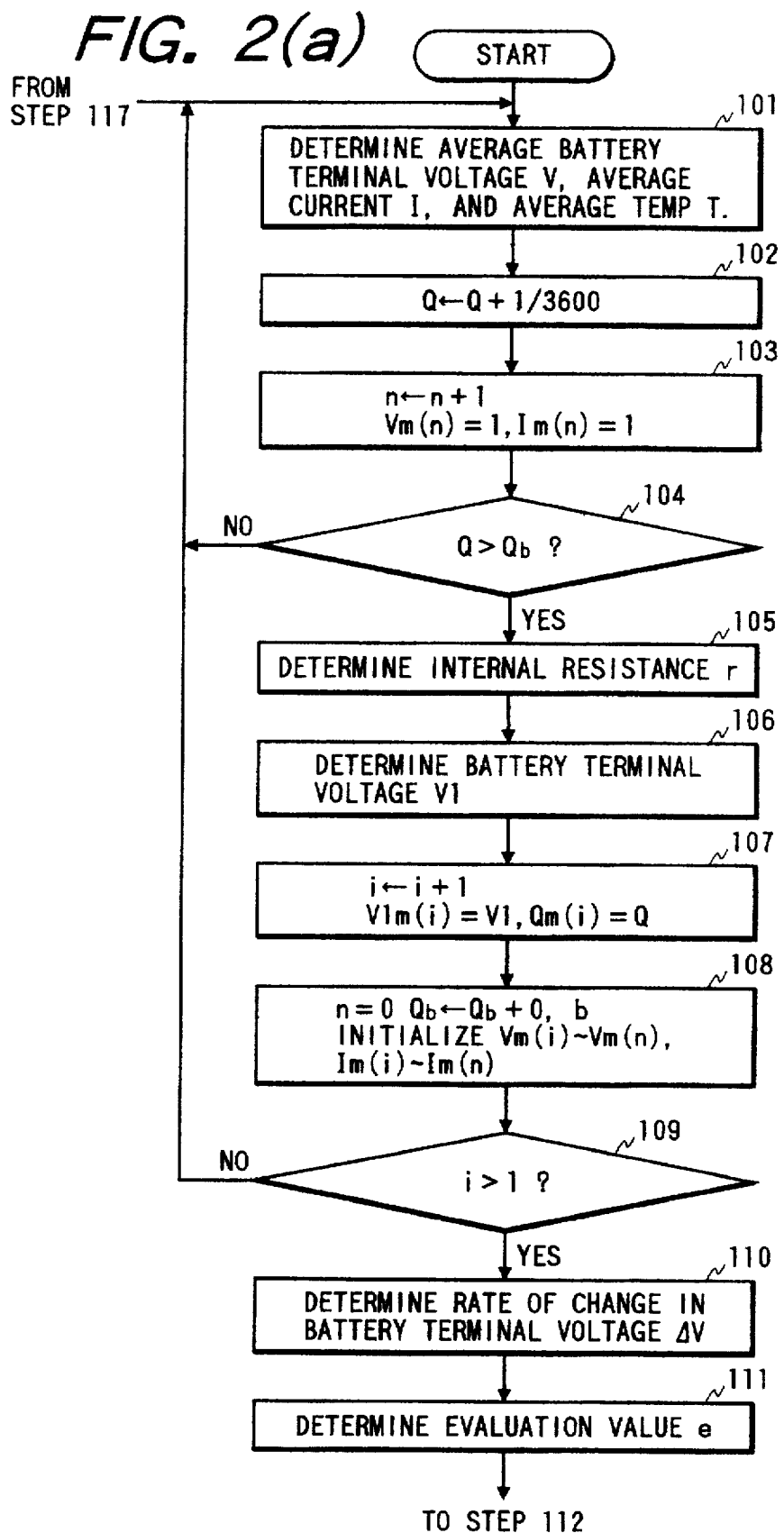

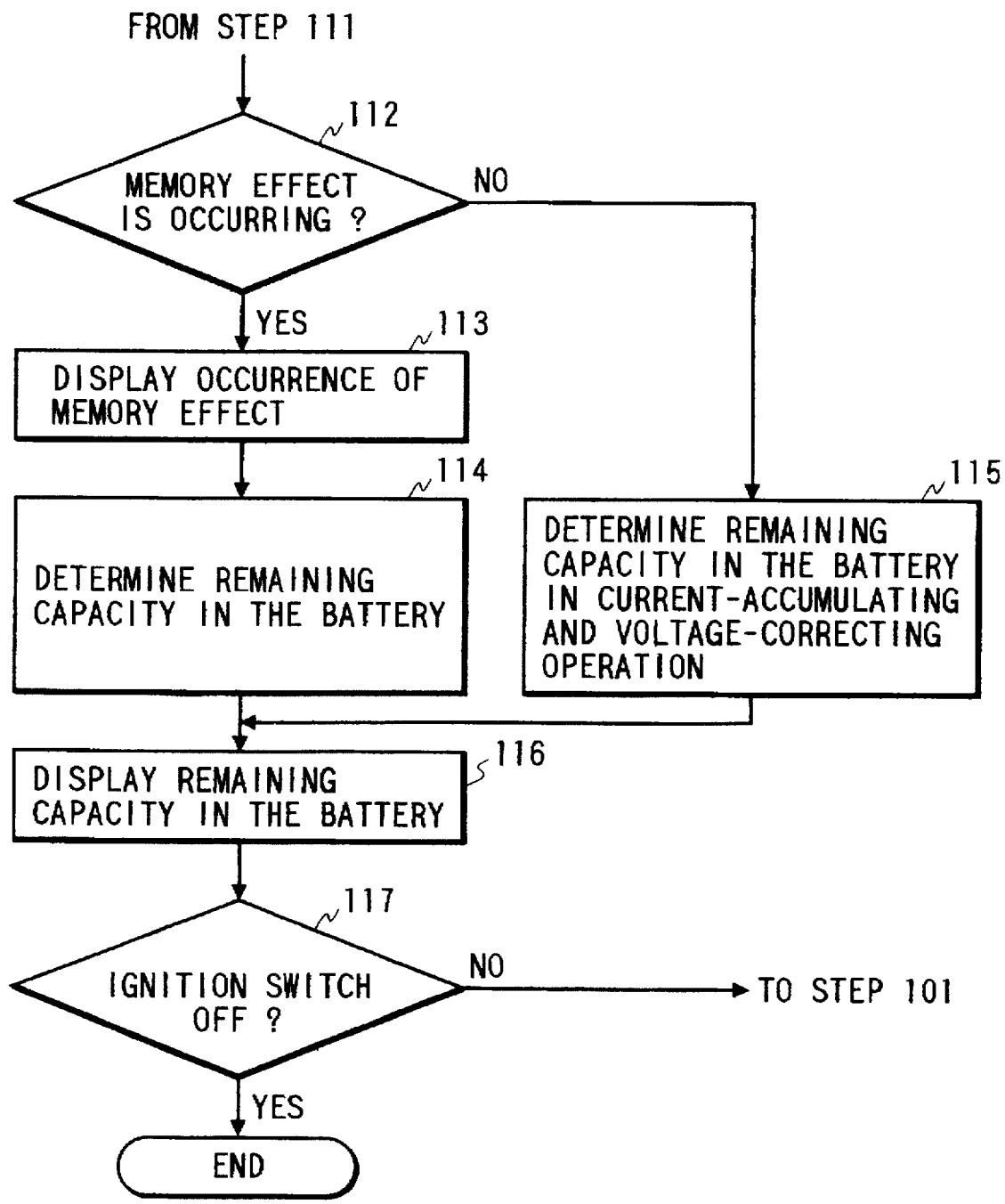

MEMORY EFFECT SENSITIVE BATTERY MONITORING APPARATUS FOR ELECTRIC VEHICLES

BACKGROUND OF THE INVENTION

1. Technical Field

The present invention relates generally to a battery condition monitoring apparatus which may be employed in electric vehicles, and more particularly to a battery condition monitoring apparatus designed to determine generation of memory effect in a battery.

2. Background of Related Art

Storage batteries which are secondary cells are in widespread use as power sources because they are rechargeable. For instance, electric vehicles need not reserve batteries like devices using primary cells as power sources, therefore, storage batteries are essential to the electric vehicles for reducing vehicle weight and saving space therein.

The electric vehicles generally have a battery capacity meter for notifying a vehicle operator of the capacity remaining in the battery. The vehicle operator reads the battery capacity meter and recharges the battery if necessary. Usually, the vehicle operator recharges the battery, leaving a margin before it is fully discharged.

When the storage battery is discharged and recharged many times before it is fully discharged, it will cause a phenomenon called memory effect to occur. FIG. 7 shows discharge characteristics when a battery discharges constant electrical energy from a fully charged state. A solid line represents the relation between a battery terminal voltage and the amount of discharged energy of a normal battery, while a broken line represents the same of an abnormal battery in which the memory effect takes place. In the normal battery, the battery terminal voltage drops rapidly immediately after discharge, drops gradually thereafter, and then rapidly reaches a fully discharged condition when the depth of discharge is increased and the remaining capacity becomes almost zero. In the abnormal battery, the battery terminal voltage assumes substantially the same characteristics as those of the normal battery until some depth of discharge is reached, but drops rapidly thereafter for a short time, drops gradually again, and then rapidly reaches a fully discharged condition, similar to the normal battery. The rapid drop of the battery terminal voltage after some depth of discharge is reached is due to the memory effect which can be eliminated by bringing the battery into the fully discharged condition several times.

Such an abnormal battery, however, encounters the following drawbacks. The memory effect causes available electrical energy of the battery to be decreased rapidly as compared with the normal battery. In addition, a battery capacity meter may indicate a remaining capacity smaller than an actual remaining capacity. The battery capacity meter is generally divided into two major types: one using a battery voltage indicating system which monitors a drop in battery terminal voltage to inform a user of the remaining capacity and the other using a current-accumulating and voltage-correcting system which measures a battery terminal voltage and a discharged current to determine a total discharged current and corrects a difference between the total discharged current and a fully charged capacity using the battery terminal voltage to determine a capacity remaining in the battery. In both types, the memory effect takes place to decrease the battery terminal voltage rapidly, thereby resulting an error in reading the remaining capacity.

Japanese Utility Model First Publication No. 5-77790 teaches a battery condition monitor which detects generation of the memory effect based on the fact that the memory effect induces the battery terminal voltage to drop at a specified depth of discharge smaller than that of a normal battery. In practice, a total amount of current discharged from a fully charged level until a given terminal voltage is reached is measured and then compared with a rated capacity. If the total amount of current measured is smaller than the rated capacity, it is determined that the memory effect is occurring.

Usually, batteries are deteriorated with time, so that they are not restored to original charged conditions, and initial voltages at the start of discharge are decreased below that of a new one. This causes the above prior art battery condition monitor to fail to determine generation of the memory effect. Additionally, the use of the battery condition monitor in a cold district results in a drop in terminal voltage of a battery, causing the monitor to fail to determine the generation of the memory effect.

SUMMARY OF THE INVENTION

It is therefore a principal object of the present invention to avoid the disadvantages of the prior art.

It is another object of the present invention to provide a battery condition monitoring system which is designed to determine generation of the memory effect in a battery with high accuracy regardless of deterioration of the battery and change in environment of use.

According to one aspect of the present invention, there is provided a battery condition monitoring system which comprises a battery terminal voltage determining means for determining a terminal voltage of a battery under discharge of a given current, a consumption determining means for determining a consumption of electric energy stored in the battery, a terminal voltage change rate determining means for determining a rate of change in terminal voltage of the battery determined in said battery terminal voltage determining means relative to change in consumption of electric energy determined by said consumption determining means, and a battery condition determining means for determining conditions of the battery, said battery condition determining means determining that memory effect is occurring in the battery when a difference between the rate of change determined in said terminal voltage change rate determining means and a reference rate representing a rate of change in terminal voltage of a normal battery relative to change in consumption of electric energy, exceeds a given value.

In the preferred mode of the invention, said consumption determining means determines a total discharged current from the battery as the consumption of electric energy.

The battery terminal voltage determining means finds a relation between a change in terminal voltage of the battery and a change in current flowing through a line connecting between the battery and a given load to determine the terminal voltage of the battery under the discharge of the given current.

A battery surface temperature determining means is further provided for determining a temperature of a surface of the battery. The reference rate is changed according to the temperature of the surface of the battery.

A remaining capacity determining means is further provided for determining a remaining capacity in the battery based on the total discharged current determined by said consumption determining means. The remaining capacity is corrected using a voltage correction value determined according to the remaining capacity in the battery.

The battery condition determining means prohibits the remaining capacity from being corrected when the memory effect occurs.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIGS. 2(a) and 2(b) show a flowchart of a program for determining occurrence of the memory effect and a remaining capacity in a storage battery;

DESCRIPTION OF THE PREFERRED EMBODIMENT

Figure 1:
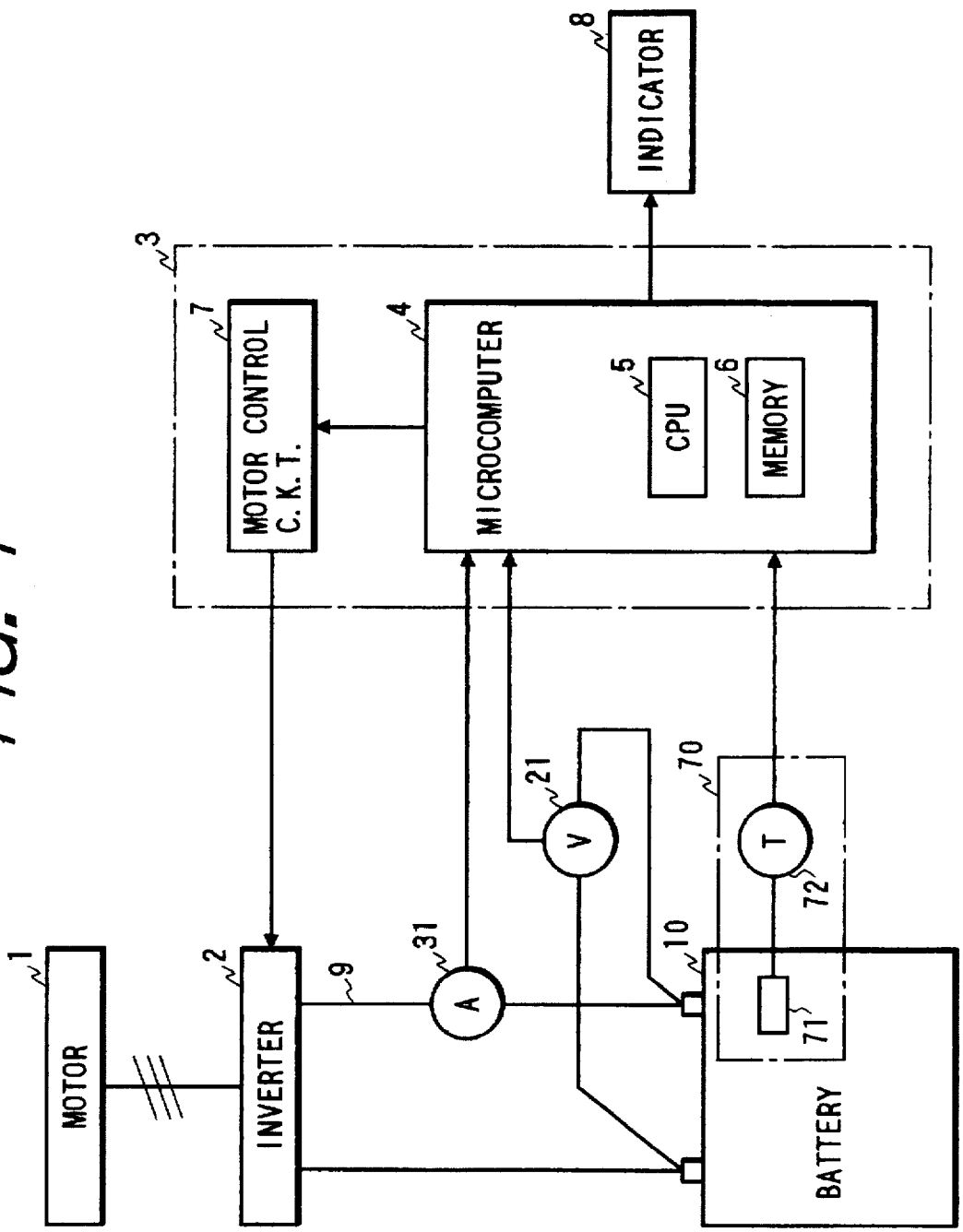
FIG. 1 is a block diagram which shows a battery condition monitoring system of the invention.

Referring now to the drawings, particularly to FIG. 1, there is shown a battery condition monitoring system according to the present invention which is mounted in an electric vehicle.

A battery pack 10 is made up of ten Ni—MH batteries connected in series each having a rated capacity of 60 Ah. An inverter 2 is connected to positive and negative terminals of the battery pack 10 to convert dc voltage into ac voltage for actuating an electric motor 1. A voltmeter 21 is also connected to the positive and negative terminal of the battery pack 10 to measure a terminal voltage of the battery pack 10 and provides a signal indicative thereof to an electronic control unit 3. An ammeter 31 is disposed in a line 9 connecting the inverter 2 and the battery pack 10 to measure the sum of a current discharged from the battery pack 10 for operating the inverter 2 and a recharging current supplied from the motor 1. A thermocouple 71 is attached to an outer surface of the battery pack 10 to measure a surface temperature of the battery pack 10 and provides a signal indicative thereof to a signal converter 72 of a temperature detector 70.

The electronic control unit 3 includes a microcomputer 4 and a motor control circuit 7. The microcomputer 4 includes a CPU 5 and a memory 6 and receives signals from the ammeter 31, the voltmeter 21, and the signal converter 72 to provide output signals to the motor control circuit 7 and an indicator 8 installed in a vehicle cabin for notifying a vehicle operator of the remaining capacity in the battery pack 10 and generation of the memory effect.

Figure 3:
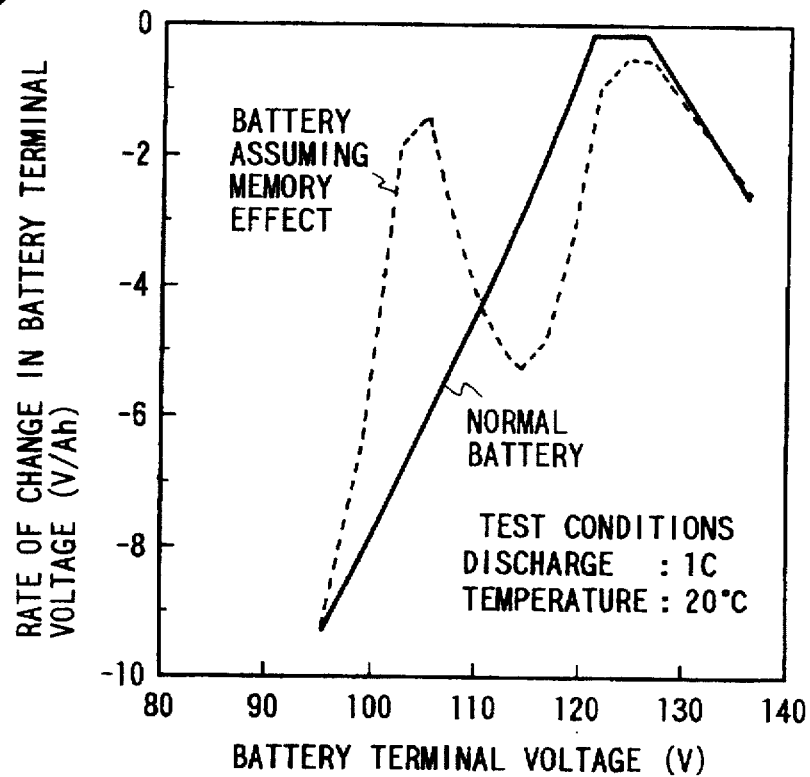
FIG. 3 is a graph which shows the relations between a rate of change in battery terminal voltage and a battery terminal voltage in a normal battery and an abnormal battery assuming the memory effect.

The memory 6 stores therein a reference voltage change rate map representing the relation between a rate of change in terminal voltage of a new battery pack having the same specifications as those of the battery pack 10 under discharge at 60A from a fully charged level to a fully discharged level relative to a total amount of discharged energy and a surface temperature of the battery pack 10, which are experimentally measured at different ambient temperatures. FIG. 3 shows the relation between the rate of change in battery terminal voltage and the battery terminal voltage when the surface temperature of the battery pack 10 is 20° C. A solid line represents one example of the reference voltage change rate stored in the memory 6 which increases linearly upon discharge from a fully charged level until it reaches approximately zero, remains constant thereafter, and then decreases linearly according to a decrease in remaining capacity.

The memory 6 stores therein a program for determining the remaining capacity in the battery pack 10 and a program for use in operating the motor control circuit 7.

The microcomputer 4 controls the motor 1 through the motor control circuit 7 and the inverter 2 according to the amount of depression of an accelerator pedal (not shown).

Referring to FIGS. 2(a) and 2(b), there is shown a flowchart of a program or sequence of logical steps performed by the CPU 5 of the ECU 3 for determining the remaining capacity in the battery pack 10.

When the battery pack 10 is fully charged by a battery charger (not shown), and the battery charger then outputs a signal indicative of completion of the charging operation to the CPU 5, the CPU 5 resets a reference discharged energy Qb to 0.6 and also resets counter values i and n of counters provided in the ECU 3, a total discharged current Q(Ah) representing a consumption of electric charge stored in the battery pack 10, and a discharged energy correction value β to initial values of zero (0), respectively. Subsequently, upon turning on an ignition switch of the electric vehicle, the program is started.

First, in step 101, a battery terminal voltage, a current, and a surface temperature of the battery pack 10 are measured every 0.1 sec. through the voltmeter 21, the ammeter 31, and the temperature detector 70 to determine an average battery terminal voltage V(V), an average current I(A), and an average surface temperature T(°C.) over 1 sec., respectively.

The routine then proceeds to step 102 wherein the quotient of the average current I divided by 3600 is added to the total discharged current Q to update it.

The routine then proceeds to step 103 wherein one (1) is added to the counter value n, and the average battery terminal voltage V and the average current I are stored in the memory 6 as parameters Vm(n) and Im(n). In this program cycle, since the counter value n is one (1), the average battery terminal voltage V and the average current I are stored as the parameters Vm(1) and Im(1), respectively.

The routine then proceeds to step 104 wherein it is determined whether the total discharged current Q is greater than the reference discharged energy Qb or not. If a NO answer is obtained, then the routine returns to step 101. Alternatively, if a YES answer is obtained, then the routine proceeds to the subsequent steps 105 and 106 to determine a battery terminal voltage V1 under constant discharge of 60A using a linear function in the following manner.

If the battery terminal voltage, the current, the battery internal resistance, and a constant are defined as V, I, r, and V0, respectively, the following linear function (1) is satisfied wherein the battery internal resistance is increased as the depth of discharge is increased.

$$V = V0 - rI \qquad (1)$$

Figure 4:
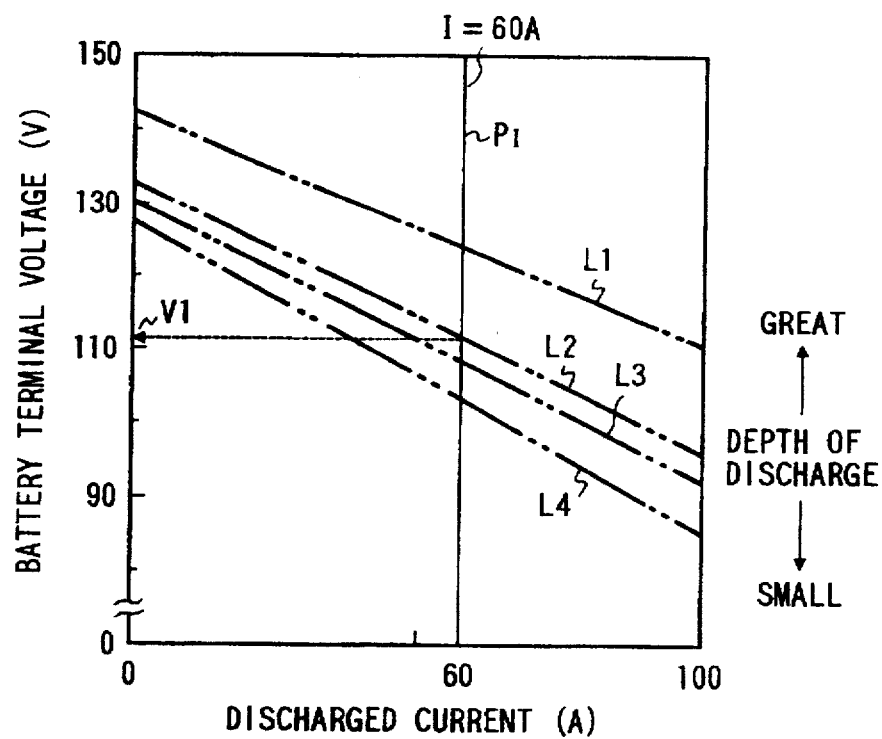
FIG. 4 is a graph which shows the relation between a battery terminal voltage and a discharged current.

FIG. 4 shows the voltage-current relation between the battery terminal voltage and the discharged current from the battery pack 10. The voltage-current relation is defined by some point on the line L1 according to the magnitude of the discharged current when the depth of discharge is small, moves along the line L1 when the discharged current is changed by, for example, the degree of acceleration during traveling of the electric vehicle, and shifts, in sequence, to the lines L2, L3, and L4 (only three are shown for the brevity of illustration) as the depth of discharge is increased. An inclination of the line L4 is greater than that of the line L3, and an inclination of the line L3 is greater than that of the line L2 because the internal resistance is increased.

When the condition in step 104 is encountered, a plurality of values are derived for each of the parameters Vm(n) and Im(n). Thus, in step 105, using the parameters Vm(1) to Vm(n) and Im(1) to Im(n) derived thus far, the internal resistance r and the constant V0 in the equation (1) are found.

Subsequently, in step 106, the values derived in step 105 are substituted for the internal resistance r and the constant V0 in the equation (1), and the battery terminal voltage V when the discharged current I is 60A is determined. This voltage will be referred to as V1.

The determination of the battery terminal voltage V1 will be explained with reference to FIG. 4. For example, if the depth of discharge corresponds to the line L2, the battery terminal voltage V1 is derived by finding an intersection of the line L2 and a vertical line PI passing through 60A.

Subsequently, the routine proceeds to step 107 wherein one (1) is added to the counter value i, the battery terminal voltage V1 under the discharge of 60A derived in step 106 and the total discharged current Q derived in step 102 are stored in the memory 6 as parameters V1m(i) and Qm(i). In this program cycle, since the counter value i is one (1), the battery terminal voltage V1 and the total discharged current Q are stored as the parameters V1m(1) and Qm(1), respectively.

The routine then proceeds to step 108 wherein the counter value n and the parameters Vm(1) to Vm(n) and Im(1) to I(m) stored in the memory 6 are initialized, and 0.6 is added to the reference discharged energy Qb to update it.

The routine then proceeds to step 109 wherein it is determined whether the counter value i is greater than one (1) or not. If a NO answer is obtained, then the routine returns back to step 101. Alternatively, if a YES answer is obtained, then the routine proceeds to step 110 wherein a rate of change of the battery terminal voltage $\Delta V$ relative to the total discharged current Q is determined according to the equation (2) below.

$$\Delta V = \{V1m(i) - V1m(i-1)\}/\{Qm(i) - Qm(i1)\} \quad (2)$$

The routine then proceeds to step 111 wherein a reference rate of terminal voltage change $\Delta Vr$ is determined based on the average surface temperature T derived in step 101 and the battery terminal voltage V1 derived in step 106 by look-up using the reference voltage change rate map stored in the memory 6, and an evaluation parameter e is determined according to the equation (3) below.

$$e = |\Delta V - \Delta Vr| \quad (3)$$

The routine then proceeds to step 112 wherein it is determined whether evaluation value e is greater than or equal to 1 V/Ah or not. If a YES answer is obtained, then the routine proceeds to step 113 wherein it is determined the memory effect is occurring, and the indicator 8 notifies the vehicle operator of the occurrence of the memory effect. A criterion provided in step 112 may alternatively be set to a variable depending upon the speed of the electric vehicle.

The routine then proceeds to step 114 wherein a remaining capacity S in the battery pack 10 is determined according to the following equation (4) and expressed in the form of a percentage when a fully charged capacity is defined as 100%. Note that Qo=60A.

$$S = (Qo - Q - \beta)/(Qo - \beta) \times 100 \quad (4)$$

where $\beta$ is a discharged energy correction value as will be discussed below in detail and is reset to zero when the battery pack 10 is fully charged.

The routine then proceeds to step 116 wherein the remaining capacity S is displayed through the indicator 8. The routine then proceeds to step 117 wherein it is determined whether the ignition switch of the electric vehicle is turned off or not. If the ignition switch is turned off, the routine terminates. Alternatively, the ignition switch remains on, the routine returns back to step 101.

In step 112, if the evaluation value e is smaller than 1 V/Ah, it is determined that the memory effect does not occur, and the routine proceeds to step 115 wherein a remaining capacity S in the battery pack 10 is determined using a current-accumulating and voltage-correcting system in the following manner. First, the discharged energy correction value $\beta$ is determined in the following equation (5).

$$\beta = K \times \{V1_{map}(S) - V1\} \quad (5)$$

where K is a constant, and V1 map(S) is a voltage value derived by inputting the remaining capacity S into a function of the remaining capacity S and the battery terminal voltage V1 stored in the memory 6 for use in the current-accumulating and voltage-correction system. Next, the remaining capacity S is determined using the equation (4) in the same manner as in step 114. The routine then proceeds to step 116 wherein the remaining capacity is displayed through the indicator 8.

The following test was performed for ascertaining the effects of the present invention. A battery known as assuming the memory effect was mounted in an electric vehicle and then discharged at 1C (i.e., 60A) at a battery surface temperature of 20° to measure an variation in battery terminal voltage relative to a total discharged current. The test results are shown by a broken line in FIG. 3. As can be seen in the drawing, a rate of voltage change (V/Ah) first decreases earlier than the reference rate of terminal voltage change due to the memory effect, increases again when some battery terminal voltage is reached, exceeds the reference rate of terminal voltage change, and decreases again. It will be noted that the rate of voltage change of the battery assuming the memory effect is clearly different from the reference rate of voltage change.

Figure 5:
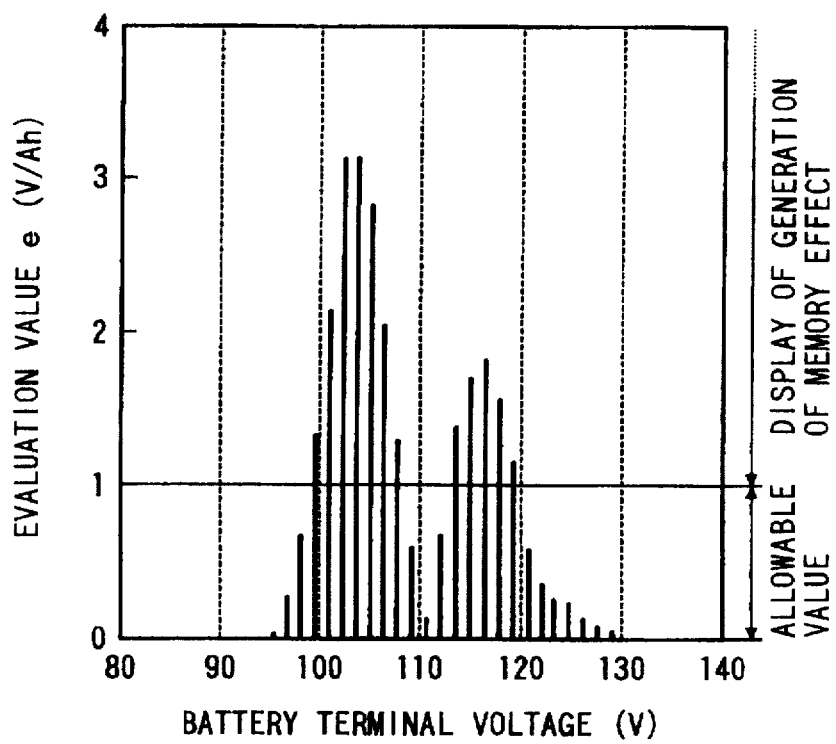
FIG. 5 is a graph which shows the relation between an evaluation value e for use in determining the generation of the memory effect and a battery terminal voltage.

FIG. 5 shows a variation in difference between the reference rate of terminal voltage change and a rate of terminal voltage change relative to a total discharged current (i.e., the evaluation value e) of a battery assuming the memory effect. Since in the above embodiment, the evaluation value e for determining the generation of the memory effect is set to 1 V/Ah, when the battery terminal voltage of the battery pack 10 indicates 120V, the memory effect is determined to be occurring. If a battery ages, the battery terminal voltage thereof at the same total discharged current is lower than that of a new, or normal battery, but a rate of battery terminal voltage change thereof relative to the total discharged current experiences substantially the same change as the reference rate of terminal voltage change. Thus, even if the evaluation value e is set to 1 or less V/Ah, it is possible to distinguish a battery exhibiting the memory effect from an aged battery.

Figure 6:
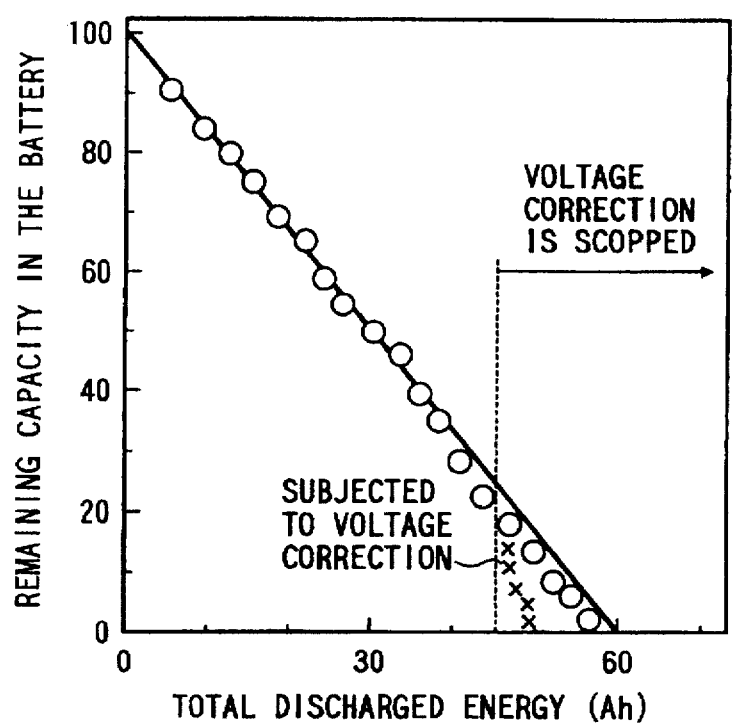
FIG. 6 is a graph which shows the relations between a remaining capacity in a battery and a total discharged current in a battery condition monitoring system of the invention and a conventional battery condition monitoring system.
Figure 7:
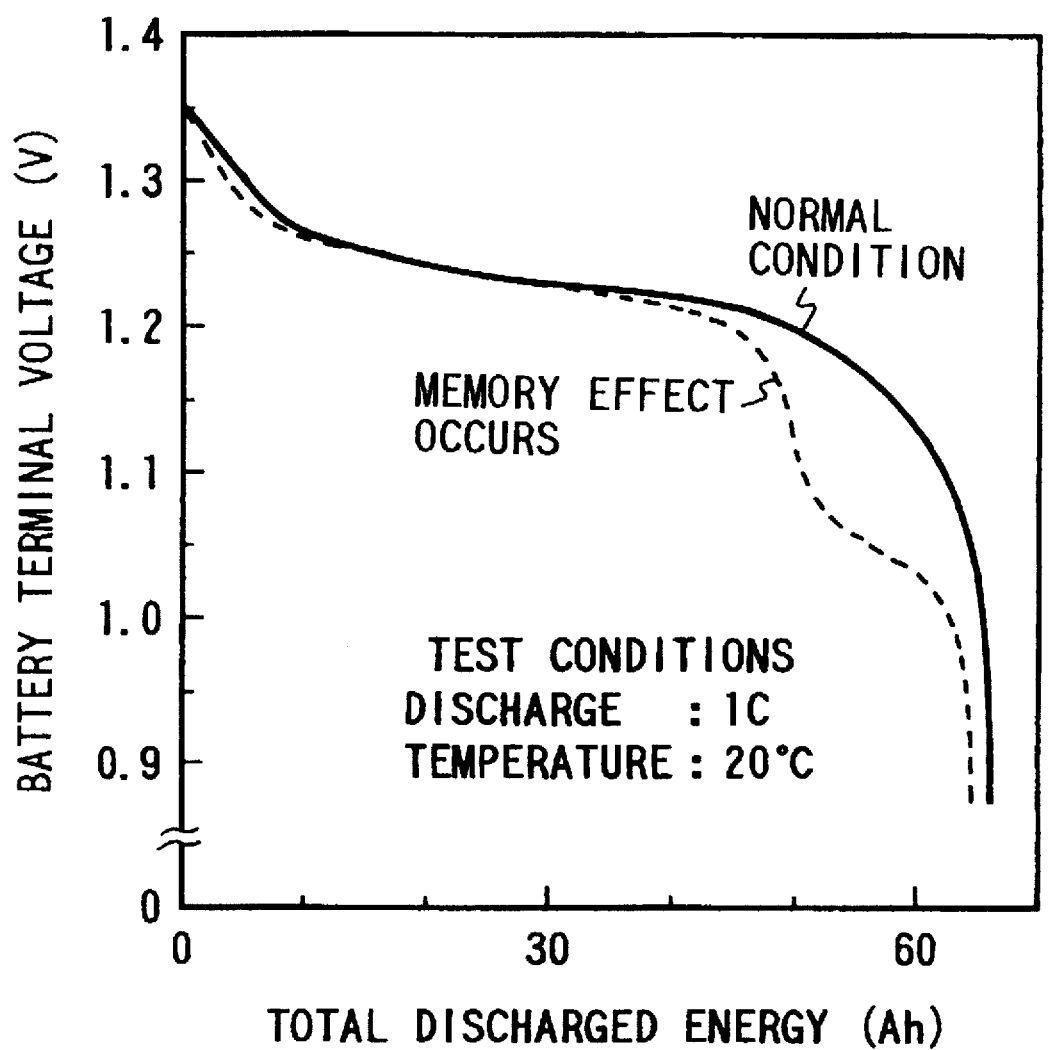
FIG. 7 is a graph which shows the relations between a battery terminal voltage and a discharged energy in a normal battery and an abnormal battery assuming the memory effect.

As another test, a battery known as exhibiting the memory effect was mounted in an electric vehicle, and the relation between a total discharged current and a remaining capacity in the battery indicated by the indicator 8 was examined during traveling of the electric vehicle at a constant speed of 60 km/h. In addition, as a comparative example, a battery known as exhibiting the memory effect was mounted in an electric vehicle, and the relation between a total discharged current and a remaining capacity in the battery which is determined in a conventional battery condition monitoring system, for example, by proceeding the routine in FIGS. 2(a) and 2(b) directly from step 112 to step 115 regardless of the generation of the memory effect, was examined during traveling of the electric vehicle at a constant speed of 60 km/h. The test results are shown in FIG. 6. A solid line represents an actual remaining capacity in the battery. Parameters plotted by "o" represent remaining capacities determined by the battery condition monitoring system of the invention. Parameters plotted by "x" represent remaining capacities after the memory effect occurs determined by the conventional battery condition monitoring system. Before the battery condition monitoring system of the invention determines that the memory effect have appeared, the battery condition monitoring system of the invention and the conventional battery condition monitoring system both calculate the remaining capacities in the same voltage correction operation so that they indicate substantially the same values along the solid line. However, in the conventional battery condition monitoring system, the voltage correction is performed even if the memory effect is occurring, so that the determined remaining capacity shows a smaller value than the actual remaining capacity. The battery condition monitoring system of the invention prohibits the voltage correction upon occurrence of the memory effect and then determines the remaining capacity according to the equation (4). Thus, the remaining capacity in the battery pack 10 is determined with a small error without the influence of a change in terminal voltage caused by the memory effect.

As apparent from the above discussion, the battery condition monitoring system of this invention is designed to determine the generation of the memory effect accurately. It is, thus, possible to accurately notify a vehicle operator when a battery should be charged fully for restoring the battery to a normal condition. In addition, a terminal voltage of the battery during traveling of an electric vehicle causing the current discharged from the battery to be changed is converted into a voltage under constant discharge of 60A for determining the generation of the memory effect and the remaining capacity. This eliminates the need for storing data other than the reference voltage change rate map in the memory 6, thereby allowing the memory capacity to be decreased. The reference rate of terminal voltage change in the map is defined depending upon the surface temperature of the battery. This makes it possible to determine the generation of the memory effect with high accuracy in a cold region.

Further, the total discharged current used as a parameter indicating a consumption of electric energy stored in the battery may alternatively be replaced with a battery power.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A battery condition monitoring system comprising:

battery terminal voltage determining means for determining a terminal voltage of a battery under discharge of a given current;

consumption determining means for determining a consumption of electric energy stored in the battery;

terminal voltage change rate determining means for determining a rate of change in terminal voltage of the battery determined in said battery terminal voltage determining means relative to change in consumption of electric energy determined by said consumption determining means; and battery condition determining means for determining conditions of the battery, said battery condition determining means determining that memory effect is occurring in the battery when a difference between the rate of change determined in said terminal voltage change rate determining means and a reference rate representing a rate of change in terminal voltage of a normal battery relative to change in consumption of electric energy, exceeds a given value.

2. A battery condition monitoring system as set forth in claim 1, wherein said consumption determining means determines a total discharged current from the battery as the consumption of electric energy.

3. A battery condition monitoring system as set forth in claim 2, wherein said battery terminal voltage determining means finds a relation between a change in terminal voltage of the battery and a change in current flowing through a line connecting between the battery and a given load to determine the terminal voltage of the battery under the discharge of the given current.

4. A battery condition monitoring system as set forth in claim 1, further comprising battery surface temperature determining means for determining a temperature of a surface of the battery, and wherein said reference rate is changed according to the temperature of the surface of the battery.

5. A battery condition monitoring system as set forth in claim 2, further comprising remaining capacity determining means for determining a remaining capacity in the battery based on the total discharged current determined by said consumption determining means, the remaining capacity being corrected using a voltage correction value determined according to the remaining capacity in the battery.

6. A battery condition monitoring system as set forth in claim 5, wherein said battery condition determining means prohibits the remaining capacity from being corrected when the memory effect occurs.

* * * * *